United States Patent [19]
Wangler

[11] Patent Number: 5,646,715
[45] Date of Patent: Jul. 8, 1997

[54] ILLUMINATING ARRANGEMENT FOR AN OPTICAL SYSTEM HAVING A RETICLE MASKING UNIT

[75] Inventor: Johannes Wangler, Königsbronn, Germany

[73] Assignee: Carl-Zeiss-Stiftung, Heidenheim, Germany

[21] Appl. No.: 355,157

[22] Filed: Dec. 8, 1994

[30] Foreign Application Priority Data

Jun. 17, 1993 [DE] Germany .............................. 9409744 U
Dec. 13, 1993 [DE] Germany .............................. 43 42 424.4

[51] Int. Cl.⁶ ................. G03F 7/20; G02B 19/00
[52] U.S. Cl. .................. 355/67; 355/70; 355/71; 359/569
[58] Field of Search .................... 355/1, 67, 70, 355/53, 71; 359/569

[56] References Cited

U.S. PATENT DOCUMENTS

| | | | |
|---|---|---|---|
| 2,708,388 | 7/1955 | Capstaff | 355/67 |
| 4,988,188 | 1/1991 | Ohta | 353/122 |
| 5,357,312 | 10/1994 | Tounai | 355/67 |
| 5,359,388 | 10/1994 | Hollman | 355/53 |
| 5,379,090 | 1/1995 | Shiraishi | 355/67 |

FOREIGN PATENT DOCUMENTS

| | | |
|---|---|---|
| 0297161 | 1/1989 | European Pat. Off. . |
| WO84/01039 | 3/1984 | WIPO . |

OTHER PUBLICATIONS

Rudolf Kingslake, Optical System Design, Academic Press, 1983, pp. 277–281 and 243–244.

Primary Examiner—Arthur T. Grimley
Assistant Examiner—Herbert V. Kerner
Attorney, Agent, or Firm—Walter Ottesen

[57] ABSTRACT

The invention is directed to an illuminating arrangement for an optical system such as a microlithographic projection exposure apparatus and includes a glass rod 5 for light integration. The reticle masking unit (REMA) 51 is mounted at the exit face of the glass rod 5.

21 Claims, 3 Drawing Sheets

ILLUMINATING ARRANGEMENT FOR AN OPTICAL SYSTEM HAVING A RETICLE MASKING UNIT

FIELD OF THE INVENTION

The invention relates to an illuminating arrangement for an optical system such as a microlithographic projection exposure apparatus having a reticle masking unit.

BACKGROUND OF THE INVENTION

Various microchips can be produced with a projection exposure apparatus and the formats of the masks on the reticle can be different. Accordingly, it is necessary to be able to variably and accurately delimit the illuminating spot on the reticle because, otherwise, exposure errors can occur. Mountings as close as possible to the reticle hinder the manipulation thereof and the requirements as to edge sharpness of the diaphragm action as it is needed for high-resolving structures cannot be satisfied. It is therefore known to provide an additional intermediate field plane in the illuminating beam path in which the reticle masking unit is precisely positioned. The additional lenses necessary therefor require a very substantial effort and additional space for equipment to meet the requirements with respect to image field, aperture, homogeneity and achromaticity.

European patent publication 0,297,161 discloses a projection exposure apparatus having a light-conducting glass rod in the illuminating beam path. A graded-density filter is mounted downstream of the glass rod and apparently provides for greater homogeneity but not for masking out light.

SUMMARY OF THE INVENTION

It is an object of the invention to provide an illuminating arrangement for an optical system having a reticle masking unit which is of high quality and only slight additional complexity.

The illuminating arrangement of the invention is for an optical system such as for a microlithographic projection apparatus and includes: light source means for providing light; a glass rod for receiving and integrating the light; the glass rod defining an optical axis and having an exit face; and, a reticle masking unit mounted at the exit face.

In illuminating arrangements of the kind referred to above, it is conventional to provide honeycomb condensers for homogenizing the distribution of light. Alternatively, a glass rod can perform this function. Use is now made of the fact that an intermediate field plane suitable for the reticle masking unit is provided at the exit end of the glass rod. Additional measures for generating an intermediate field plane are therefore not required.

The embodiments of claims 4 to 12 are also disclosed in U.S. Pat. No. 5,572,287 which is incorporated herein by reference.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
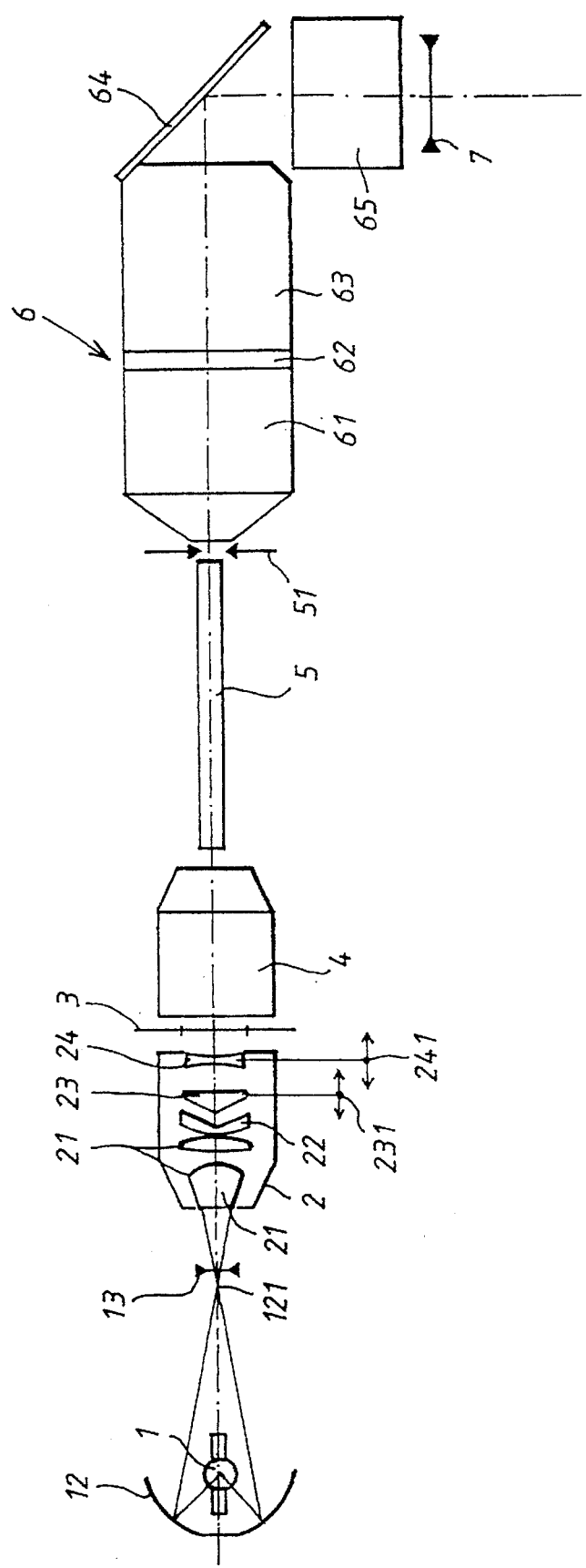
FIG. 1 is a schematic of an embodiment of the illuminating arrangement according to the invention equipped with a zoom axicon.

FIG. 1 is an embodiment of an illuminating arrangement according to the invention for projection lithography with resolutions to less than 1 µm, for example, for the manufacture of integrated circuits.

Lamp 1 is a mercury short-arc lamp for the i-line of 365 nm wavelength and is mounted in one focal point of an elliptical mirror 12. The mirror 12 collects the emitted light in the second focal point 121.

As a departure, the shutter 13 is mounted outside of the focal point 121 and the spacing to the apex of the elliptical mirror 12 is approximately 5 to 20% (preferably 10%) greater than the spacing of the focal point 121 to the apex. In this way, the secondary light source formed here is more homogeneous and the partially coherent effect of the illumination of the optical imaging is improved. In this way, an extra mixing system for this purpose becomes unnecessary. This measure is also advantageous in an otherwise conventional illuminating arrangement.

As an alternative, an ultraviolet laser is also advantageous as a light source.

The downstream objective 2 comprises a first lens group 21, the concave first axicon 22, the convex second axicon 23 and a second lens group 24. First positioning means 231 permits axicon 23 to be displaced and second positioning means 241 permits an element of the lens group 24 to be displaced. In this way, the spacing of the axicons (22, 23) with respect to each other can be adjusted and the annular aperture character can be accordingly changed. In addition, a zoom action for changing the illuminated pupil diameter (that is, the degree of coherence σ) can also be achieved.

A second objective 4 follows downstream of the pupil intermediate plane 3 and couples the light into the glass rod 5 having a length of approximately 0.5 meter. The output of the glass rod 5 defines an intermediate field plane in which a masking unit 51 is mounted in lieu of the conventional REMA system (reticle masking system). The otherwise conventional additional intermediate field plane for the REMA system with its complex lens groups thereby becomes unnecessary.

The configuration of the reticle masking unit 51 otherwise corresponds to the conventional fine mechanical embodiments. However, it should be noted that the boundary lines run precisely in a plane. An advantageous configuration includes knife-edge diaphragms positioned inclined and symmetrical to the optical axis so that reflections from its surfaces can be effectively removed from the beam path of the illuminating arrangement.

The downstream objective 6 images the intermediate field plane with the masking unit 51 on the reticle 7 (mask, lithographic pattern) and includes a first lens group 61, a pupil intermediate plane 62 in which a filter or diaphragm can be mounted, second and third lens groups (63 and 65) and a deflection mirror 64 therebetween. The mirror 64 permits the large illuminating arrangement (approximately 3 meters in length) to be built in horizontally and thereby permits the reticle 7 to be positioned horizontally.

Figure 2A:
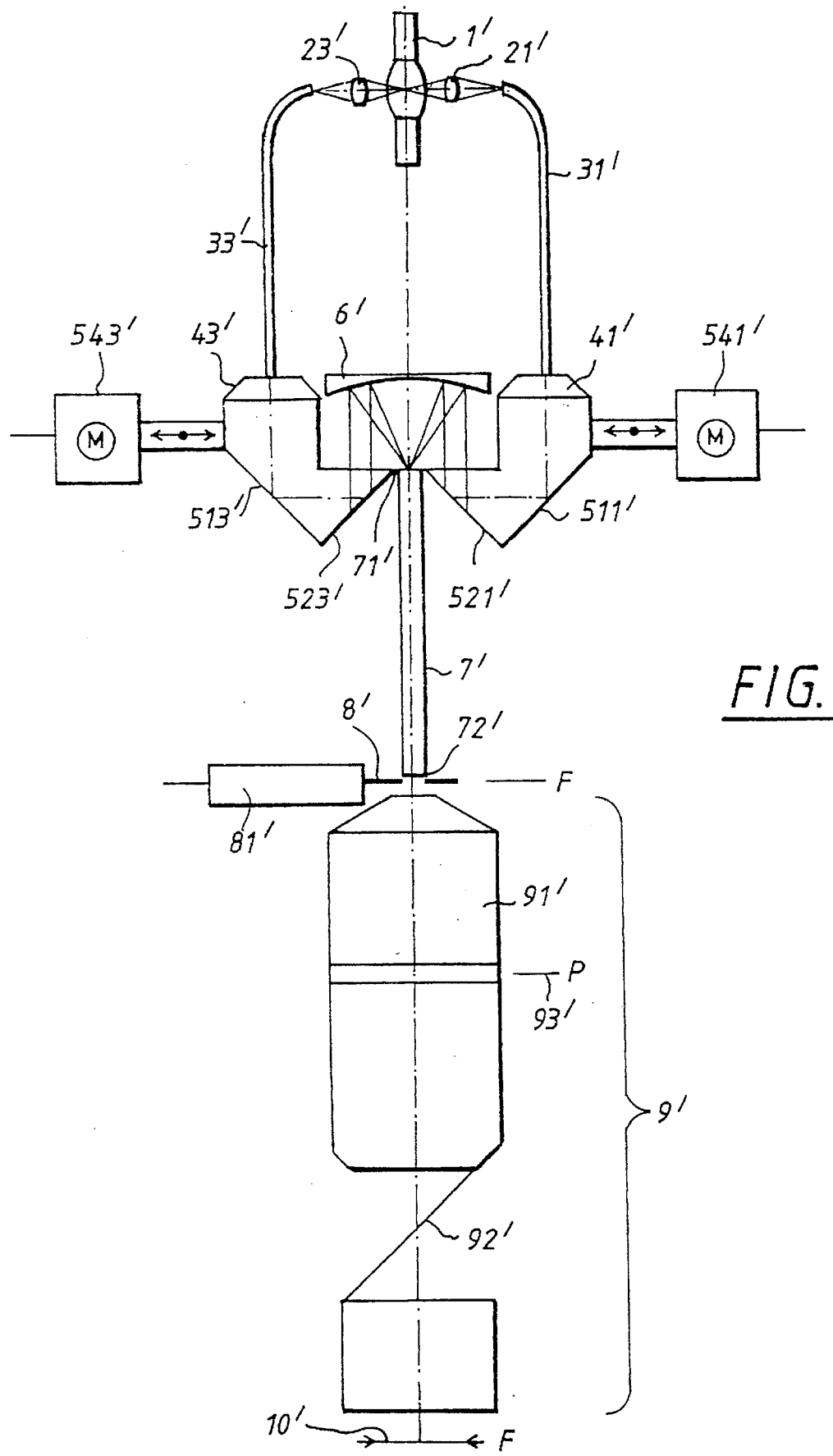
FIG. 2a is a schematic showing an embodiment with a displaceable mirror unit for selecting the particular type of illumination; and, FIG. 2b is a schematic representation of the embodiment of FIG. 2a and is shown in plan.
Figure 2B:
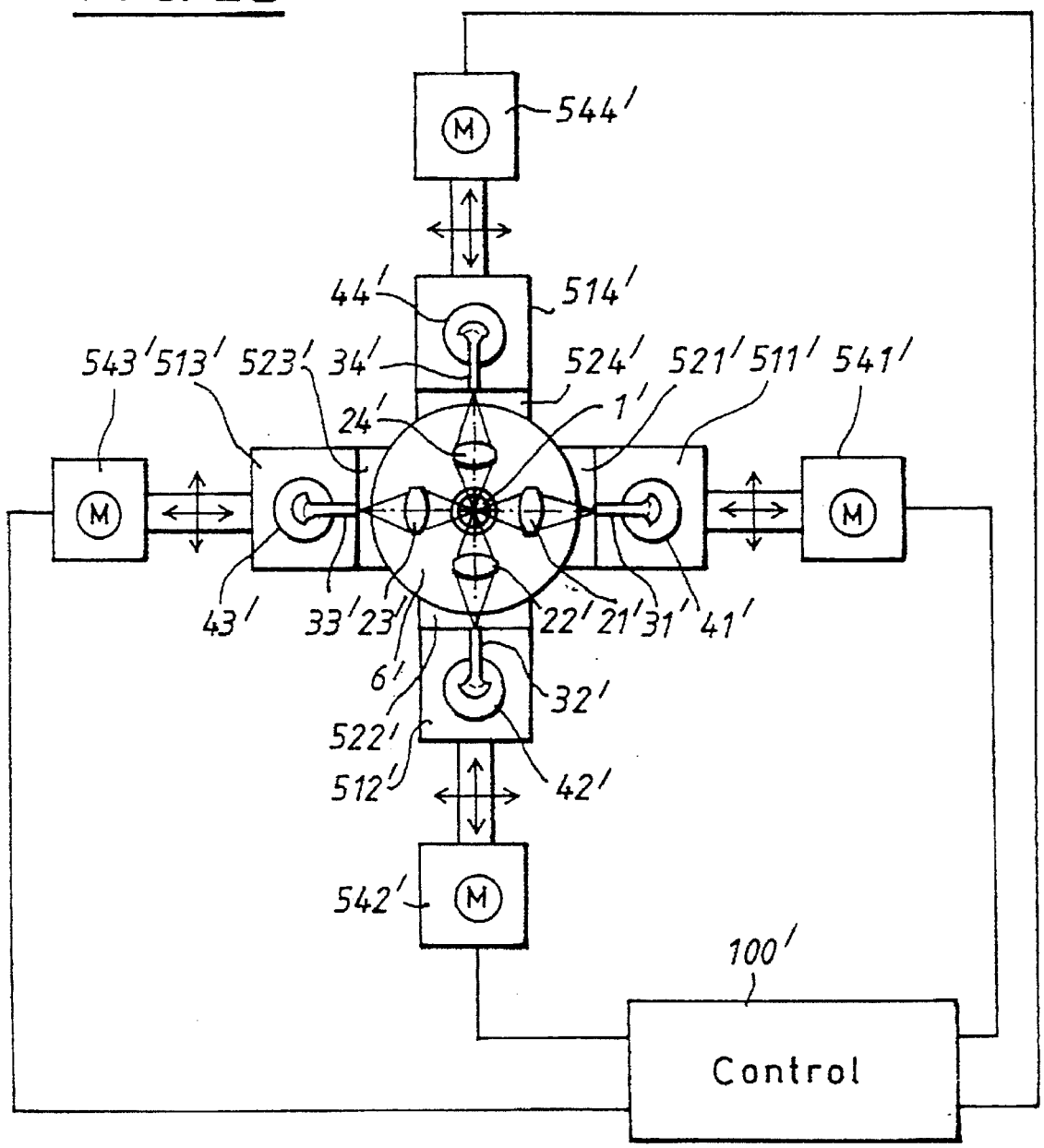

A mercury short-arc lamp is shown as a light source 1' in the embodiment shown in FIGS. 2a and 2b. The light flux of the light source 1' is gathered by four collectors (21' to 24') with each collector gathering a large spatial angle region so that most of the light is supplied to the four light conductors (31' to 34'). The light conductors (31' to 34') are configured as cross-sectional converters having exit faces shaped as respective annular segments. The light conductors (31' to 34') are assembled, for example, from statistically mixed individual fibers to substantially homogenize the light intensity over the exit faces. The entry cross section can also be adapted to the light distribution.

As an alternative, the illumination of the light conductors (31' to 34') can also be realized by a laser having a beam-expanding optic and a pyramid mirror as a geometric beam splitter. The laser is then, for example, an excimer laser emitting in the ultraviolet range.

The following are downstream of each of the exit faces of the four light conductors (31' to 34'): a unit comprising a relay optic (41', 42', 43' or 44'), a first deflecting mirror (511', 512', 513' or 514') and a second deflecting mirror (521', 522', 523' or 524'). These units including the connected ends of the flexibly configured light conductors (31', 32', 33' or 34') are displaceable or scannable radially and azimuthally by means of positioning drives (541', 542', 543' or 544'). A control 100' controls the position drives (541' to 544').

The light coming from the four deflecting mirrors (521' to 524') is imaged on the entry face 71' of the glass rod 7' via the in-coupling mirror 6'. This entry face 71' lies in a pupillary plane P of the illuminating arrangement and each of the four units can illuminate respective parts of one quadrant of this inlet face depending upon the position of the positioning drives (541' to 544'). The four light fluxes gathered by the collectors (21' to 24') are here geometrically assembled to an effective secondary light source.

A field plane F is disposed at the exit face 72' of the glass rod 7'. According to the invention, a reticle masking unit 8' is mounted in the field plane F. The reticle masking unit 8' is an adjustable diaphragm. The reticle masking system (REMA) is displaced by the positioning means 81' as required.

With the reticle masking unit 8' at this position, the complexity for providing an additional field plane only for the reticle masking unit is obviated compared to known solutions.

The downstream intermediate imaging system 9' is an objective having a pupillary plane (P) 93'. The intermasking system 91' is disposed upstream of the pupillary plane P and a beam deflector 92' is disposed downstream thereof. The beam deflector 92' comprises a planar mirror which, in a manner known per se, makes possible a more compact overall assembly. The reticle 10 to be illuminated follows in the field plane F.

The embodiments shown in FIGS. 2a and 2b are included and described in U.S. Pat. No. 5,572,287, incorporated herein by reference.

The downstream projection objective and the wafer to be illuminated are known per se and therefore not illustrated.

It is understood that the foregoing description is that of the preferred embodiments of the invention and that various changes and modifications may be made thereto without departing from the spirit and scope of the invention as defined in the appended claims.

What is claimed is:

1. An illuminating arrangement for an optical system such as for a microlithographic projection apparatus, the illuminating arrangement comprising:

light source means for providing light;

a glass rod for receiving and integrating said light;

said glass rod defining an optical axis and having an exit face; and, a reticle masking unit mounted at said exit face.

2. The illuminating arrangement of claim 1, said light source means including:

a light source for emitting said light;

an objective arranged on said optical axis and being interposed between said light source and said glass rod; and, said objective including an axicon on said optical axis.

3. The illuminating arrangement of claim 2, said axicon being a first axicon and said objective further including a second axicon on said axis at a distance away from said first axicon; and, said arrangement further comprising: displacing means operatively connected to said first and second axicons for continuously adjusting said distance whereby the following illuminations can be adjusted: conventional illumination, annular aperture illumination and multipole illuminations of various geometries.

4. The illuminating arrangement of claim 3, said first and second axicons being mounted on said optical axis one directly behind the other; said first axicon being concave and said second axicon being convex; and, said first and second axicons having respective tips and both of said tips being directed in the same direction.

5. The illuminating arrangement of claim 4, said tips each defining the same acute angle $\alpha$.

6. The illuminating arrangement of claim 5, wherein said objective has a zoom function.

7. The illuminating arrangement of claim 4, wherein said distance can be reduced until said axicons come into contact engagement with each other.

8. The illuminating arrangement of claim 4, wherein said axicons are each conical.

9. The illuminating arrangement of claim 4, wherein said axicons each have a pyramidal shape.

10. The illuminating arrangement of claim 1, said light source means comprising a light mirror centered on said optical axis and defining a focal point; a light source for emitting light mounted at said focal point; and, a diaphragm arranged on said axis away from said focal point and defining a secondary light source.

11. The illuminating arrangement of claim 1, said reticle masking unit including diaphragm plates mounted on said axis so as to be inclined with respect thereto.

12. The illuminating arrangement of claim 1, wherein the optical system is for a microlithographic projection apparatus for illuminating a reticle; and, wherein said glass rod defines an intermediate field plane at said exit face; and, said illuminating arrangement further comprises an objective downstream of said reticle masking unit for imaging said intermediate field plane with said reticle masking unit on said reticle; and, said reticle masking unit being a field stop for delimiting the area of said reticle which is illuminated.

13. An illuminating arrangement for an optical system such as for a microlithographic projection apparatus, the illuminating arrangement comprising:

light source means for providing light;

a glass rod for receiving and integrating said light;

said glass rod defining an optical axis and having an exit face;

a reticle masking unit mounted at said exit face;

a device mounted between said light source means and said glass rod, said device selectively providing various types of illumination including conventional illumination having an adjustable coherence factor ($\sigma$), illumination via an annular aperture and symmetrically inclined illumination from two or four directions, said device including: first light collecting means for collecting a first portion of said light in a first spatial angle region of said light; first shaping means for receiving and shaping said first portion of said light into a first shaped flux of light; second light collecting means for collecting a second portion of said light in a second spatial angle region of said light; and, second shaping means for receiving and shaping said second portion of said light into a second shaped flux of light;

objective means defining a pupillary plane and a reticle plane downstream of said pupillary plane;

said pupillary plane being conjugated to said reticle plane for the reticle to be imaged;

said device further including imaging means for imaging images of said first and second shaped fluxes of light into sectors of said pupillary plane;

said glass rod being interposed between said planes for transmitting said fluxes of light to said reticle plane; and, said device further including: first displacing means for operating on said first shaped flux of light so as to radially and azimuthally displace the image of said first shaped flux of light in said pupillary plane; and, second displacing means for operating on said second shaped flux of light so as to radially and azimuthally displace the image of said second shaped flux of light in said pupillary plane.

14. The illuminating arrangement of claim 13, said first and second shaping means for shaping said portions of light including first and second light conductors, respectively.

15. The illuminating arrangement of claim 14, said first and second light conductors having first and second outputs, respectively; said first displacing means being operatively connected to said first light conductor to displace said first output; and, said second displacing means being operatively connected to said second light conductor to displace said second output.

16. The illuminating arrangement of claim 13, said imaging means including first and second displaceable reflecting units for reflecting said first and second shaped fluxes of light, respectively; and, said first and second displacing means operatively connected to said first and second reflecting units, respectively, for displacing said reflecting units.

17. The illuminating arrangement of claim 13, wherein said images of said first and second shaped fluxes of light are so dimensioned in said pupillary plane that said images are suitable for said symmetrically inclined illumination or for said conventional illumination.

18. The illuminating arrangement of claim 13, further comprising means for changing the size of said images of said first and second fluxes of light in said pupillary plane.

19. The illuminating arrangement of claim 13, further comprising means for changing the shape of said fluxes of light.

20. The illuminating arrangement of claim 13, further comprising means for shaping said fluxes of light to have cross sections in the form of annular segments.

21. The illuminating arrangement of claim 13, said light source being a laser.

* * * * *